US011679533B2

(12) United States Patent
Sevier et al.

(10) Patent No.: US 11,679,533 B2
(45) Date of Patent: Jun. 20, 2023

(54) METHODS AND APPARATUSES FOR CASTING OPTICAL POLYMER FILMS

(71) Applicant: Magic Leap, Inc., Plantation, FL (US)

(72) Inventors: Jeremy Lee Sevier, Austin, TX (US); Matthew S. Shafran, Fletcher, NC (US); Satish Sadam, Round Rock, TX (US); Roy Matthew Patterson, Hutto, TX (US); Kangkang Wang, Austin, TX (US); Chieh Chang, Cedar Park, TX (US); Charles Scott Carden, Austin, TX (US)

(73) Assignee: Magic Leap, Inc., Plantation, FL (US)

( * ) Notice: Subject to any disclaimer, the term of this patent is extended or adjusted under 35 U.S.C. 154(b) by 125 days.

(21) Appl. No.: 17/200,239

(22) Filed: Mar. 12, 2021

(65) Prior Publication Data

US 2021/0283806 A1 Sep. 16, 2021

Related U.S. Application Data

(60) Provisional application No. 62/988,704, filed on Mar. 12, 2020.

(51) Int. Cl.
*B29C 39/44* (2006.01)
*B29C 71/04* (2006.01)
*B29C 39/10* (2006.01)
*B29L 11/00* (2006.01)

(52) U.S. Cl.
CPC .............. *B29C 39/44* (2013.01); *B29C 39/10* (2013.01); *B29C 71/04* (2013.01); *B29L 2011/0066* (2013.01)

(58) Field of Classification Search
CPC ......... B29C 39/10; B29C 71/04; B29C 39/44; B29C 2037/90; B29L 2011/0066
See application file for complete search history.

(56) References Cited

U.S. PATENT DOCUMENTS

| | | | |
|---|---|---|---|
| 2002/0093122 A1 | 7/2002 | Choi et al. | |
| 2013/0162997 A1 | 6/2013 | Kast et al. | |
| 2018/0264691 A1 | 9/2018 | Chang et al. | |
| 2019/0111642 A1 | 4/2019 | Chang et al. | |
| 2020/0038954 A1* | 2/2020 | Regulin | ................ B29C 64/153 |

OTHER PUBLICATIONS

International Search Report and Written Opinion in International Appln. No. PCT/US2021/022157, dated May 26, 2021, 9 pages.

* cited by examiner

*Primary Examiner* — Francisco W Tschen
*Assistant Examiner* — Elisa H Vera
(74) *Attorney, Agent, or Firm* — Fish & Richardson P.C.

(57) ABSTRACT

In an example method of forming an optical film for an eyepiece, a curable material is dispensed into a space between a first and a second mold surface. A position of the first mold surface relative to the second mold surface is measured using a plurality of sensors. Each sensor measures a respective relative distance along a respective measurement axis between a respective point on a planar portion of the first mold surface and a respective point on a planar portion of the second mold surface. The measurement axes are parallel to each other, and the points define corresponding triangles on the first and second mold surfaces, respectively. The position of the first mold surface is adjusted relative to the second mold surface based on the measured position, and the curable material is cured to form the optical film.

18 Claims, 10 Drawing Sheets

METHODS AND APPARATUSES FOR CASTING OPTICAL POLYMER FILMS

CROSS-REFERENCE TO RELATED APPLICATIONS

This application claims the benefit under 35 U.S.C. § 119(e) of U.S. Patent Application No. 62/988,704, entitled "Methods And Apparatuses For Casting Optical Polymer Films," filed Mar. 12, 2020, which is incorporated herein by reference in its entirety.

TECHNICAL FIELD

This disclosure relates to optical polymer films and methods for producing the same.

BACKGROUND

Optical imaging systems, such as wearable imaging headsets, can include one or more eyepieces that present projected images to a user. Eyepieces can be constructed using thin layers of one or more highly refractive materials. As examples, eyepieces can be constructed from one or more layers of highly refractive glass, silicon, metal, or polymer substrates.

In some cases, an eyepiece can be patterned (e.g., with one or more light diffractive nanostructures), such that it projects an image according to a particular focal depth. For an example, to a user viewing a patterned eyepiece, the projected image can appear to be a particular distance away from the user.

Further, multiple eyepieces can be used in conjunction to project a simulated three-dimensional image. For example, multiple eyepieces—each having a different pattern—can be layered one atop another, and each eyepiece can project a different depth layer of a volumetric image. Thus, the eyepieces can collectively present the volumetric image to the user across three-dimensions. This can be useful, for example, in presenting the user with a "virtual reality" environment or an "augmented reality" environment.

To improve the quality of a projected image, an eyepiece can be constructed such that unintended variations in the eyepiece are eliminated, or otherwise reduced. For example, an eyepiece can be constructed such that it does not exhibit any wrinkles, uneven thicknesses, or other physical distortions that might negatively affect the performance of the eyepiece.

SUMMARY

System and techniques for producing polymer films are described herein. One or more of the described implementations can be used to produce polymer film in a highly precise, controlled, and reproducible manner. The resulting polymer films can be used in a variety of variation-sensitive applications in which extremely tight tolerances on film dimensions are desired. For instance, the polymer films can be used in optical applications (e.g., as a part of eyepieces in a head mounted display device, such as one used for presenting virtual reality content and/or augmented reality content) in which material homogeneity and dimensional constraints are on the order of optical wavelengths or smaller.

In general, polymer films are produced by enclosing a photocurable material (e.g., a photopolymer or light-activated resin that hardens when exposed to light) between two mold structures, and curing the material (e.g., by exposing the material to light and/or heat). The physical characteristics of the polymer film (e.g., the thickness and shape of the polymer film) can be controlled, at least in part, by controlling the position of the mold structures relative to one another during the curing process. To facilitate accurate positioning of the mold structures, a system can measure the positions of at least three points on each of the mold structures (e.g., three non-linear points that form a notional triangle on a planar surface of the mold structure). Based on this information, the system can determine the position of the mold structures in space, and adjust the position of one or more of the mold structures to reduce or eliminate misalignment between the opposing mold surfaces that contact the polymer film. For example, where surfaces of the mold structures are to be arranged parallel to one another, the system can reduce or eliminate any deviation of the surfaces from parallel. Accordingly, variations in thickness and/or distortions in the resulting polymer film may be reduced.

In an aspect, method of forming an optical film for an eyepiece includes dispensing a curable material into a space between a first mold surface and a second mold surface opposite the first mold surface, and measuring, using a plurality of sensors, a position of the first mold surface relative to the second mold surface, Measuring the position of the first mold surface relative to the second mold surface includes determining a first relative distance along a first measurement axis between a first point on a planar portion of the first mold surface and a first point on a planar portion of the second mold surface using a first of the sensors, determining a second relative distance along a second measurement axis between a second point on the planar portion of the first mold surface and a second point on the planar portion of the second mold surface using a second of the sensors, and determining a third relative distance along a third measurement axis between a third point on the planar portion of the first mold surface and a third point on the planar portion of the second mold surface using a third of the sensors. The first, second, and third measurement axes are parallel to each other. The first, second, and third points define corresponding triangles on the first and second mold surfaces, respectively. The space between the first and second mold surfaces is located within the triangles. The method also includes adjusting the position of the first mold surface relative to the second mold surface based on the measured position, and curing the curable material in the space to form the optical film.

Implementations of this aspect can include one or more of the following features.

In some implementations, the position of the first mold surface relative to the second mold surface can be measured prior to curing the curable material.

In some implementations, the position of the first mold surface relative to the second mold surface can be measured concurrently with curing the curable material.

In some implementations, the position of the first mold surface relative to the second mold surface can be measured continuously over time.

In some implementations, the position of the first mold surface relative to the second mold surface can be adjusted prior to curing the curable material.

In some implementations, the position of the first mold surface relative to the second mold surface can be adjusted concurrently with curing the curable material.

In some implementations, the position of the first mold surface relative to the second mold surface is adjusted continuously over time.

In some implementations, adjusting the position of the first mold surface relative to the second mold surface can include determining, based on the position of the first mold surface relative to the second mold surface, one or more adjustments to at least one of a position of the first mold surface or a position of the second mold surface to reduce an angle between the planar portion of the first mold surface and the planar portion of the second mold surface. Adjusting the position of the first mold surface relative to the second mold surface can also include activating one or more actuators to move the at least one of the first mold surface or the second mold surface according to the one or more determined adjustments.

In some implementations, the one or more adjustments can include at least one of a translation of at least one of the first mold surface or the second mold surface along an axis of translation, or a rotation of at least one of the first mold surface or the second mold surface about an axis of rotation.

In some implementations, the axis of translation can be substantially parallel to the first, second, and third measurement axes.

In some implementations, the axis of rotation can be substantially orthogonal to the first, second, and third measurement axes.

In some implementations, adjusting the position of the first mold surface relative to the second mold surface can include determining, based on the first relative distance along a first measurement axis, the second relative distance along a second measurement axis, and the third relative distance along a third measurement axis: coordinates (x1, y1, z1) of the first point on the planar portion of the first mold surface or the first point on the planar portion of the second mold surface with respect to a Cartesian coordinate system, coordinates (x2, y2, z2) of the second point on the planar portion of the first mold surface or the second point on the planar portion of the second mold surface with respect to the Cartesian coordinate system, and coordinates (x3, y3, z3) of the third point on the planar portion of the first mold surface or the third point on the planar portion of the second mold surface with respect to the Cartesian coordinate system.

In some implementations, adjusting the position of the first mold surface relative to the second mold surface can include determining the one or more adjustments are determined according to a relationship $$\begin{bmatrix} y1 & -x1 & 1 \\ y2 & -x2 & 1 \\ y3 & -x3 & 1 \end{bmatrix} \begin{bmatrix} Rx \\ Ry \\ Z \end{bmatrix} = \begin{bmatrix} z1 \\ z2 \\ z3 \end{bmatrix},$$

where Z corresponds to the translation of at least one of the first mold surface or the second mold surface along an axis of translation, where Rx corresponds to the rotation of at least one of the first mold surface or the second mold surface about a first axis of rotation, and where Ry corresponds to the rotation of at least one of the first mold surface or the second mold surface about a second axis of rotation.

In some implementations, the plurality of sensors can include one or more low-coherence interferometry (LCI) sensors.

In some implementations, the one or more LCI sensors can be mounted on a first mold portion that includes the first mold surface or a second mold portion that comprises the second mold surface. Measuring the position of the first mold surface relative to the second mold surface can include directing an optical beam from each of the one or more LCI sensors along a corresponding measurement axis so that, for each LCI sensor, a first portion of the optical beam reflects from the first mold surface and a second portion of the optical beam reflects from the second mold surface. The reflected portions of the optical beam can be detected by the LCI sensor.

In some implementations, the one or more LCI sensors can be mounted remote from the first mold surface or the second mold portion. Directing the optical beam from at least one of the LCI sensors can include reflecting the optical beam with a mirror toward the first and second mold surfaces.

In some implementations, the curable material can include a photocurable material. Curing the curable material to form the optical film can include irradiating the photocurable material with radiation suitable for photocuring the photocurable material.

In some implementations, the curable material can be confined entirety within the space between the first mold surface and the second mold surface during the curing of the curable material.

In some implementations, the method further include separating the optical film from the first mold portion and the second mold portion.

In some implementations, the method can further include assembling a head mounted display including the optical film formed using one or more of the methods described herein.

In another aspect, a system for forming an optical film for an eyepiece includes system having a first mold portion, a second mold portion, a dispenser, a measurement apparatus, one or more actuators, and a curing apparatus. The first mold portion has a first mold surface. The second mold portion has a second mold surface, where the first mold surface is opposite the first mold surface. The measurement apparatus includes a plurality of sensors. The one or more actuators are coupled to at least one of the first mold portion or the second mold portion. The dispenser is configured, during operation of the system, to dispense a curable material into a space between the first mold surface. The measurement apparatus is configured, during operation of the system, to measure a position of the first mold surface relative to the second mold surface. Measuring the position of the first mold surface relative to the second mold surface comprises includes determining a first relative distance along a first measurement axis between a first point on a planar portion of the first mold surface and a first point on a planar portion of the second mold surface using a first of the sensors, determining a second relative distance along a second measurement axis between a second point on the planar portion of the first mold surface and a second point on the planar portion of the second mold surface using a second of the sensors, and determining a third relative distance along a third measurement axis between a third point on the planar portion of the first mold surface and a third point on the planar portion of the second mold surface using a third of the sensors. The first, second, and third measurement axes are parallel to each other. The first, second, and third points define corresponding triangles on the first and second mold surfaces, respectively. The space between the first and second mold surfaces is located within the triangles. The one or more actuators are configured, during operation of the system, to adjust the position of the first mold surface relative to the second mold surface based on the measured position. The curing apparatus is configured, during operation of the system, to cure the curable material in the space to form the optical film.

Implementations of this aspect can include one or more of the following features.

In some implementations, the measurement apparatus can be configured, during operation of the system, to measure the position of the first mold surface relative to the second mold surface is prior to the curing the curable material by the curing apparatus.

In some implementations, the measurement apparatus can be configured, during operation of the system, to measure the position of the first mold surface relative to the second mold surface concurrently with the curing the curable material by the curing apparatus.

In some implementations, the measurement apparatus can be configured, during operation of the system, to measure the position of the first mold surface relative to the second mold surface continuously over time.

In some implementations, the one or more actuators can be configured, during operation of the system, to adjust the position of the first mold surface relative to the second mold surface prior to the curing the curable material by the curing apparatus.

In some implementations, the one or more actuators can be configured, during operation of the system, to adjust the position of the first mold surface relative to the second mold surface concurrently with the curing the curable material by the curing apparatus.

In some implementations, the one or more actuators can be configured, during operation of the system, to adjust the position of the first mold surface relative to the second mold surface continuously over time.

In some implementations, the measurement apparatus can include a control module configured, during operation of the system, to determine, based on the position of the first mold surface relative to the second mold surface, one or more adjustments to at least one of a position of the first mold surface or a position of the second mold surface to reduce an angle between the planar portion of the first mold surface and the planar portion of the second mold surface. The control module also can configured, during operation of the system, to generate one or more control signals to activate the one or more actuators to move the at least one of the first mold surface or the second mold surface according to the one or more determined adjustments.

In some implementations, the one or more adjustments can include at least one of a translation of at least one of the first mold surface or the second mold surface along an axis of translation, or a rotation of at least one of the first mold surface or the second mold surface about an axis of rotation.

In some implementations, the axis of translation can be substantially parallel to the first, second, and third measurement axes.

In some implementations, the axis of rotation can be substantially orthogonal to the first, second, and third measurement axes.

In some implementations, the control module can be configured, during operation of the system, to determine, based on the first relative distance along a first measurement axis, the second relative distance along a second measurement axis, and the third relative distance along a third measurement axis: coordinates (x1, y1, z1) of the first point on the planar portion of the first mold surface or the first point on the planar portion of the second mold surface with respect to a Cartesian coordinate system, coordinates (x2, y2, z2) of the second point on the planar portion of the first mold surface or the second point on the planar portion of the second mold surface with respect to the Cartesian coordinate system, and coordinates (x3, y3, z3) of the third point on the planar portion of the first mold surface or the third point on the planar portion of the second mold surface with respect to the Cartesian coordinate system.

In some implementations, the control module can be configured, during operation of the system, to determine the one or more adjustments according to a relationship $$\begin{bmatrix} y1 & -x1 & 1 \\ y2 & -x2 & 1 \\ y3 & -x3 & 1 \end{bmatrix} \begin{bmatrix} Rx \\ Ry \\ Z \end{bmatrix} = \begin{bmatrix} z1 \\ z2 \\ z3 \end{bmatrix},$$

where Z corresponds to the translation of at least one of the first mold surface or the second mold surface along an axis of translation, where Rx corresponds to the rotation of at least one of the first mold surface or the second mold surface about a first axis of rotation, and where Ry corresponds to the rotation of at least one of the first mold surface or the second mold surface about a second axis of rotation.

In some implementations, the plurality of sensors can include one or more low-coherence interferometry (LCI) sensors.

In some implementations, the one or more LCI sensors can be mounted on the first mold portion or the second mold portion. The measurement apparatus can be configured, during operation of the system, to direct an optical beam from each of the one or more LCI sensors along a corresponding measurement axis so that, for each LCI sensor, a first portion of the optical beam reflects from the first mold surface and a second portion of the optical beam reflects from the second mold surface. The reflected portions of the optical beam can be detected by the LCI sensor.

In some implementations, the one or more LCI sensors can be mounted remote from the first mold surface or the second mold portion. The measurement apparatus can be configured, during operation of the system, to reflect the optical beam with a mirror toward the first and second mold surfaces.

In some implementations, the curable material can include a photocurable material. The curing apparatus can include a radiation source. The curing apparatus can be configured, during operation of the system, to irradiate, using the radiation source, the photocurable material with radiation suitable for photocuring the photocurable material.

The details of one or more embodiments are set forth in the accompanying drawings and the description below. Other features and advantages will be apparent from the description and drawings, and from the claims.

DETAILED DESCRIPTION

System and techniques for producing polymer film are described herein. One or more of the described implementations can be used to produce polymer film in a highly precise, controlled, and reproducible manner. The resulting polymer films can be used in a variety of variation-sensitive applications (e.g., as a part of eyepieces in an optical imaging system).

In some implementations, polymer films can be produced such that wrinkles, uneven thicknesses, or other unintended physical distortions are eliminated or otherwise reduced. This can be useful, for example, as the resulting polymer film may exhibit more predictable physical and/or optical properties. For example, polymer films produced in this manner can guide and diffract light in a more predictable and consistent manner, and thus, may be more suitable for use a high-resolution optical imaging system. In some implementations, optical imaging systems using these polymer films can produce sharper and/or higher resolution images than might otherwise be possible with other polymer films.

Figure 1:
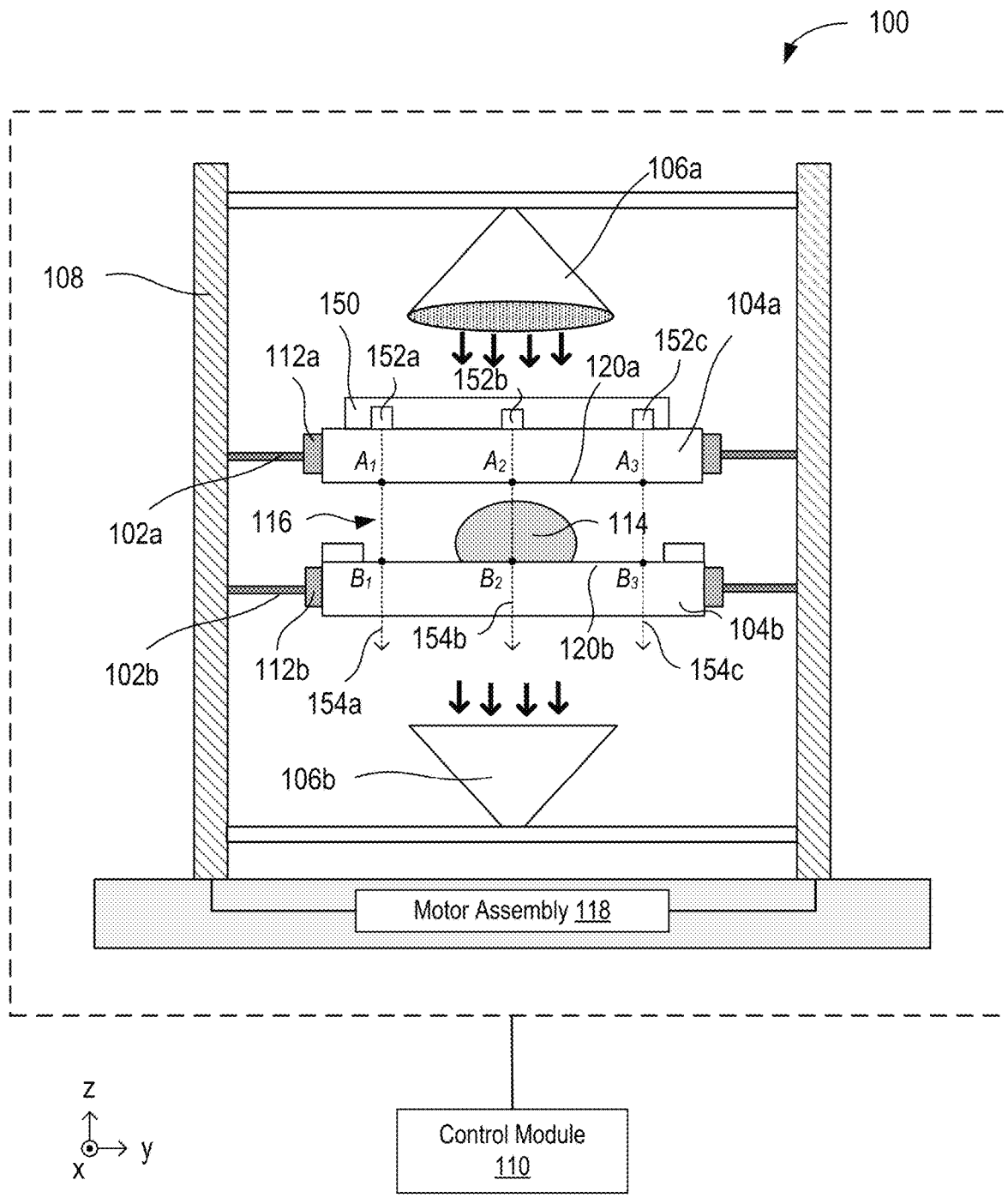
FIG. 1 is a diagram of an example system for producing polymer products.

An example system 100 for producing polymer film is shown in FIG. 1. The system 100 includes two actuable stages 102a and 102b, two mold structures 104a and 104b, two light sources 106a and 106b, a support frame 108, a control module 110, and a position determination module 150.

During operation of the system 100, the two mold structures 104a and 104b (also referred to as "optical flats") are secured to the actuable stages 102a and 102b, respectively (e.g., through clamps 112a and 112b). In some implementations, the clamps 112a and 112b can be magnetic (e.g., electromagnets) and/or pneumatic clamps that enable the mold structures 104a and 104b to be reversibly mounted to and removed from the actuable stages 102a and 102b. In some implementations, the clamps 112a and 112b can be controlled by a switch and/or by the control module 110 (e.g., by selectively applying electricity to the electromagnets of the clamps 112a and 112b and/or selectively actuating pneumatic mechanisms to engage or disengage the molds structures).

A photocurable material 114 (e.g., a photopolymer or light-activated resin that hardens when exposed to light) is deposited into the mold structure 104b. The mold structures 104a and 104b are moved into proximity with one another (e.g., by moving the actuable stages 102a and/or 102b vertically along the support frame 108), such that the photocurable material 114 is enclosed by the mold structures 104a and 104b. The photocurable material 114 is then cured (e.g., by exposing the photocurable material 114 to light from the light sources 106a and/or 106b), forming a thin film having one or more features defined by the mold structures 104a and 104b. To facilitate curing, the mold structures 104a and 104b can be partially or fully transparent to radiation at one or more wavelengths suitable for photocuring the photocurable material 114 (e.g., between 315 nm and 430 nm). After the photocurable material 114 has been cured, the mold structures 104a and 104b are moved away from each other (e.g., by moving the actuable stages 102a and/or 102b vertically along the support frame 108), and the film is extracted.

The actuable stages 102a and 102b are configured to support the mold structures 104a and 104b, respectively. Further, the actuable stages 102a and 102b are configured to manipulate the mold structures 104a and 104b, respectively, in one or more dimensions to control a gap volume 116 between the mold structures 104a and 104b.

For instance, in some implementations, the actuable stage 102a can translate the mold structure 104a along one or more axes. As an example, the actuable stage 102a can translate the mold structure 104a along an x-axis, a y-axis, and/or a z-axis in a Cartesian coordinate system (i.e., a coordinate system having three orthogonally arranged axes). In some implementations, the actuable stage 102a can rotate, tip, or tilt the mold structure 104a about one or more axes. As an example, the actuable stage 102a can rotate the mold structure 104a along an x-axis (e.g., to "roll" the mold structure 104a), a y-axis (e.g., to "pitch" the mold structure 104a), and/or a z-axis (e.g., to "yaw" the mold structure 104a) in a Cartesian coordinate system. Translation and/or rotation with respect to one or more other axes are also possible, either in addition to or instead of those described above. Similarly, the actuable stage 102b can also translate the mold structure 104b along one or more axes and/or rotate the mold structure 104b about one or more axes.

In some implementations, the actuable stages 102a can manipulate the mold structure 104a according to one or more degrees of freedom (e.g., one, two, three, four, or more degrees of freedom). For instance, the actuable stage 102a can manipulate the mold structure 104a according to six degrees of freedom (e.g., translation along an x-axis, y-axis, and z-axis, and rotation about the x-axis, y-axis, and z-axis). Manipulation according to one or more other degrees of freedom is also possible, either in addition to or instead of those described above. Similarly, the actuable stage 102b can also manipulate the mold structure 104b according to one or more degrees of freedom In some implementations, the actuable stages 102a and 102b can include one or more motor assemblies configured to manipulate the mold structures 104a and 104b and control the gap volume 116. For example, the actuable stages 102a and 102b can include a motor assembly 118 configured to manipulate the actuable stages 102a and 102b, thereby repositioning and/or reorienting the actuable stages 102a and 102b. The motor assembly 118 can include, for example, one or more motors or actuators coupled to the actuable stages 102a and/or 102b.

In the example shown in FIG. 1, both the actuable stage 102a and the actuable stage 102b can be moved relative to the support frame 108 to control the gap volume 116. However, in some implementations, one of the actuable stages can be moved relative to the support frame 108, whereas the other can remain static with respect to the support frame 108. For example, in some implementations, the actuable stage 102a can be configured to translate in one or more dimensions relative to the support frame 108 through the motor assembly 118, whereas the actuable stage 102b can be held static with respect to the support frame 108. In some implementations, one of the actuable stages can be moved according to a certain number of degrees of freedom (e.g., six degrees of freedom), whereas the other actuable stage can be moved according to a different number of degrees of freedom (e.g., three degrees of freedom).

The mold structures 104a and 104b collectively define an enclosure for the photocurable material 114. For example, the mold structures 104a and 104b, when aligned together, can define a hollow mold region (e.g., the gap volume 116) within which the photocurable material 114 can be deposited and cured into a film. The mold structures 104a and 104b can also define one or more structures in the resulting film.

For example, the mold structures 104a and 104b can include one or more protruding structures (e., gratings) from the surfaces 120a and/or 120b that impart a corresponding channel in the resulting film. As another example, the mold structures 104a and 104b can include one or more channels defined in the surfaces 120a and/or 120b that impart a corresponding protruding structure in the resulting film. In some implementations, the mold structures 104a and 104b can impart a particular pattern on one or both sides of the resulting film. In some implementations, the mold structures 104a and 104b need not impart any pattern of protrusions and/or channels on the resulting film at all. In some implementations, the mold structures 104a and 104b can define a particular shape and pattern, such that the resulting film is suitable for use as an eyepiece in an optical imaging system (e.g., such that the film has one or more light diffractive microstructures or nanostructures that impart particular optical characteristics to the film).

The physical characteristics of the polymer film (e.g., the thickness and shape of the polymer film) can be controlled, at least in part, by controlling the position of the mold structures 104a and 104b relative to one another during the curing process. To facilitate accurate positioning of the mold structures, the system 100 can use the position determination module 150 to measure the positions of at least three points on each of the mold structures 104a and 104b (e.g., three non-linear points that form a notional triangle on the surfaces 120a and 120b). Based on this information, the system 100 can determine the position of the mold structures 104a and 104b in space, and adjust the position of one or more of the mold structures 104a and 104b to reduce or eliminate misalignment between the opposing mold surfaces that contact the polymer film (e.g., such that the surfaces 120a and 120b are parallel or substantially parallel). For example, where surfaces of the mold structures are to be arranged parallel to one another, the system can reduce or eliminate any deviation of the surfaces from parallel. Accordingly, variations in thickness and/or distortions in the resulting polymer film may be reduced.

As an example, the position determination module can include at least three sensor modules 152a-152c mounted to the mold structure 104a. Each sensor module 152a-152c can be configured to measure the position of a point $A_1$-$A_3$, respectively, on the mold structure 104a (e.g., a point on the surface 120a) and a point $B_1$-$B_3$, respectively, on the mold structure 104b (e.g., a point on the surface 120b) along a measurement axis 154a-154c, respectively. Further, the measurement axes 154a-154c can be parallel to one another (e.g., aligned along the z-axis).

The points $A_1$-$A_3$ can form a notional triangle. For example, the points $A_1$-$A_3$ can be arranged in a non-linear pattern, such as notional line segments extending between the points $A_1$ $A_2$, the points $A_2$-$A_3$, and the points $A_3$-$A_1$ form a equilateral, isosceles, or scalene triangle. This enables the position determination module 110 to determine the position of the mold structure 104a in three-dimensional space, including the tilt angles of the mold structure 104a with respect to the x-, y-, and z-axes.

Similarly, the points $B_1$-$B_3$ also can form a notional triangle. For example, the points $B_1$-$B_3$ can be arranged in a non-linear pattern, such as notional line segments extending between the points $B_1$ $B_2$, the points $B_2$-$B_3$, and the points $B_3$-$B_1$ form a equilateral, isosceles, or scalene triangle. This enables the position determination module 150 to determine the position of the mold structure 104b in three-dimensional space, including the tilt angles of the mold structure 104b with respect to the x-, y-, and z-axes.

In some implementations, one or more of the sensor modules 152a-152c can include one or more low-coherence interferometry (LCI) sensor. An LCI sensor is a non-contact sensor that directs a beam of low-coherence light at a sample surface and sends reflected light signals to an interferometric detector (e.g., an interferometer) via an optical fiber for interpretation. When the measured sample includes of a stack of transparent or translucent material layers, light reflections are received by the detector from each interface where a reflection occurs, including the top and bottom of each layer. The interferometer interprets the reflected optical data from each interface and records it as a depth profile. In certain cases, the interferometer combines the reflected light with reference light from the same source. Where the optical path length of the reflected light matches, or approximately matches to within the coherence length of the source, the combined light interferences changing the intensity of the combined light (e.g., through constructive or destructive interference). By scanning the optical path length difference (e.g., by mechanically or optically scanning the reference light's optical path), the sensor can generate an interference signal where each interface causes a set of corresponding interference fringes. The distance between these fringes corresponds to the optical path difference between two interfaces. Multiple LCI sensors (e.g., three or more) can be used to determine the relative position of each layer in three-dimensions at multiple different scan points.

Figure 2:
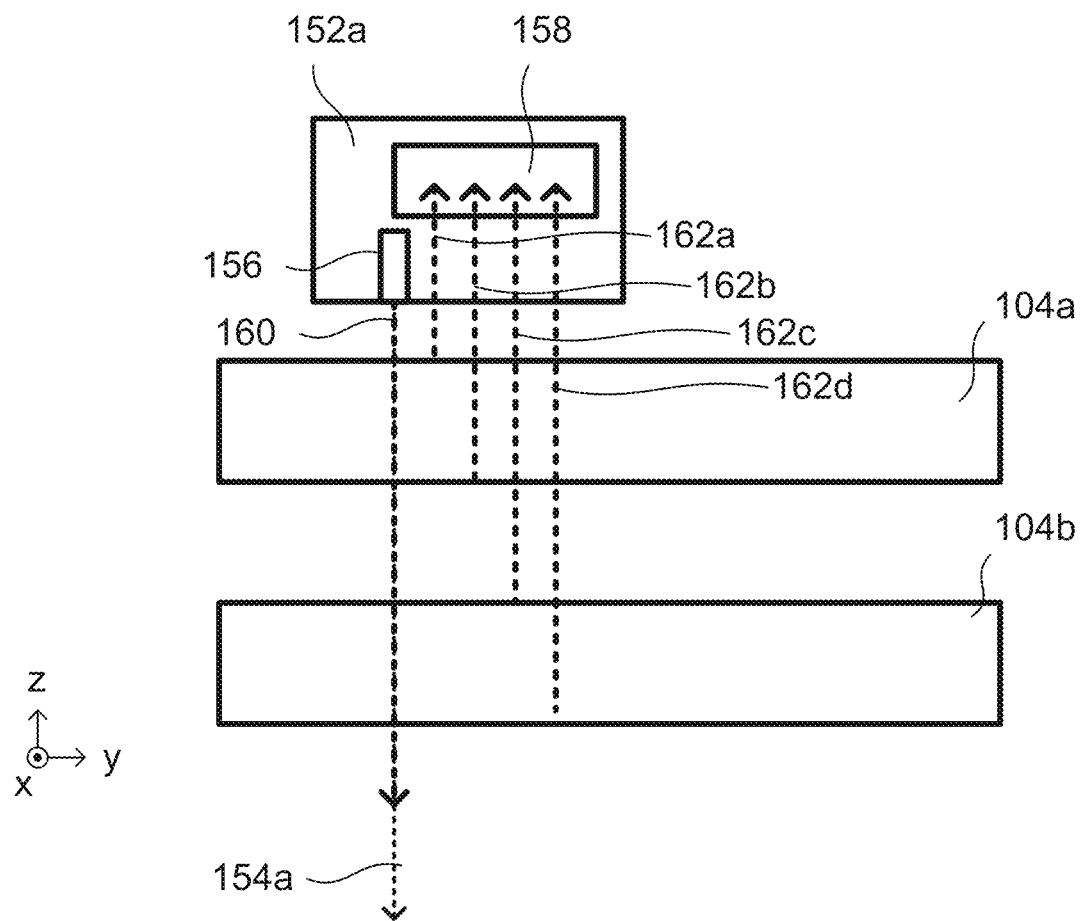
FIG. 2 is a diagram of an example sensor module for determining a relative depth or distance between points on two mold structures.

As a simplified example, FIG. 2 shows a sensor module 152a including a light source 156 (e.g., a broadband light source) and an interferometer 158. During operation, the light source 156 directs a beam of low-conference light 160 towards the mold structures 104a and 104b (e.g., along a measurement axis 154a parallel to the z-axis). At least a portion of the light 160 reflects from each interface of the mold structures 104a and 104b and the surrounding medium (e.g., air) back towards the interferometer 158. For example, at least a portion of the light 160 can reflect from an upper surface of the mold structure 104a as a light ray 162a, at least a portion of the light 160 can reflect from a lower surface of the mold structure 104a as a light ray 162b, at least a portion of the light 160 can reflect from an upper surface of the mold structure 104b as a light ray 162c, and at least a portion of the light 160 can reflect from a lower surface of the mold structure 104b as a light ray 162d. For ease of illustration, FIG. 2 shows the beam of light 160 and the light rays 162a-164d in a row. However, it is understood that the beam of light 160 and the light rays 162a-164d can be superimposed over one another (e.g., along the measurement axis 154a).

The sensor module 152a measures the reflected light rays 162a-164d using the interferometer 158, and based on the measurements, determines of positions of the mold structure 104a and 104b (e.g., the relative depth of each of the interfaces along the measurement axis 154a, and/or the relative distance between each interface). In some implementations, the sensor module 152a can generate a plot that maps the optical path of reflected light to and from each interface (e.g., on the horizontal axis) against the intensity of the reflected light (e.g., on the vertical axis). The relative depths of the surfaces of the mold structure 104a and 104b (e.g., relative to the sensor module 152a) can be determined by identifying the peaks in the plot, corresponding to the reflection of light at the interfaces.

Each of the other sensor modules of the position determination module 150 (e.g., the sensors modules 152b and 152c) can be configured in a similar manner as the sensor module 152a shown in FIG. 2. Further, although FIG. 1 shows a position determination module 150 having three sensor modules 152a-152c, in practice, a position determination module 150 can include more than three sensors modules (e.g., to determine the positions of additional points on the surfaces of the mold structure).

Figure 3A:
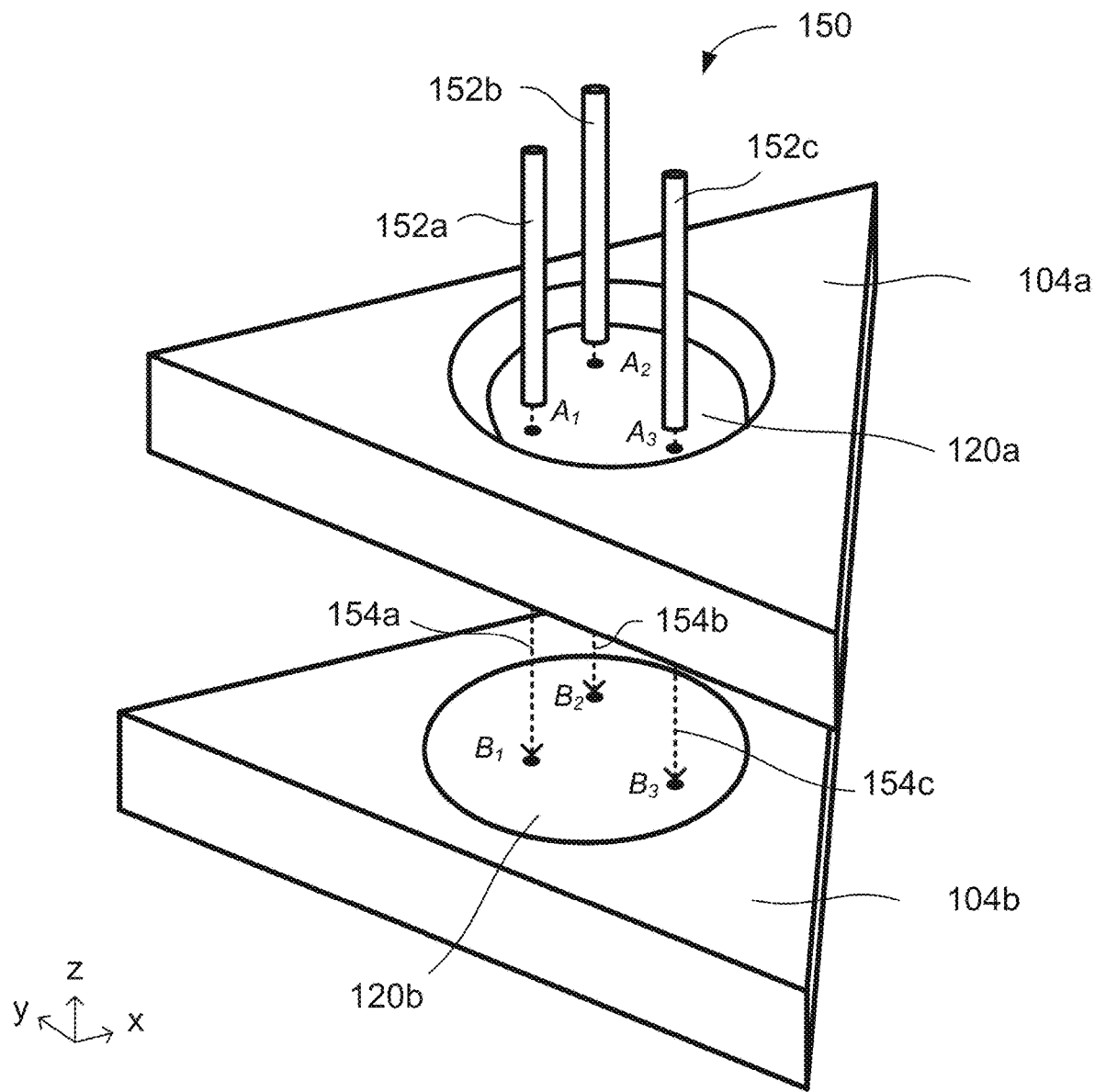
FIG. 3A is a diagram of an example module for determining the positions mold structures relative to one another.

In some implementations, each of the sensor modules 152a-152c can be positioned such that they emit beams of light 160 directly through the mold structures 104a and/or 104b. For example, FIG. 3A shows a perspective view of an example configuration of the position determination module 150 relative to the mold structure 104a and the mold structure 104b. In this example, the sensor module 152a-152c are directly mounted to the mold structure 104a in such a way that the light sources of the sensor module 152a-152b emit light along measurement axes 154a-154c, respectively. The measurement axes 154a-154c can be parallel to one another (e.g., aligned along the z-axis).

In some implementations, each of the sensor modules 152a-152c can be positioned in such a way that they emit a beam of light in a direction that does not extend through the mold structures 104a and/or 104b. Further, the beams of light can be reflected (e.g., by one or more mirrors or other reflective surfaces) such that they pass through the mold structures 104a and/or 104b (e.g., through respective measurement axes 154a-154c). Similarly, light reflecting from the mold structures 104a and 104b can be reflected back to the sensor modules 152a-152c via the mirror or reflective surface for measurement. This can be useful, for example, as it enables the sensor modules 152a-152c to be positioned more flexibly with respect to the other components of the system 100. For example, the sensor modules 152a-152c can be positioned remote from the mold surfaces 104a and/or 104b, or positioned in such a way that they do not block the light emitted by the light sources 106a or 106b from reaching the gap volume 116.

Figure 3B:
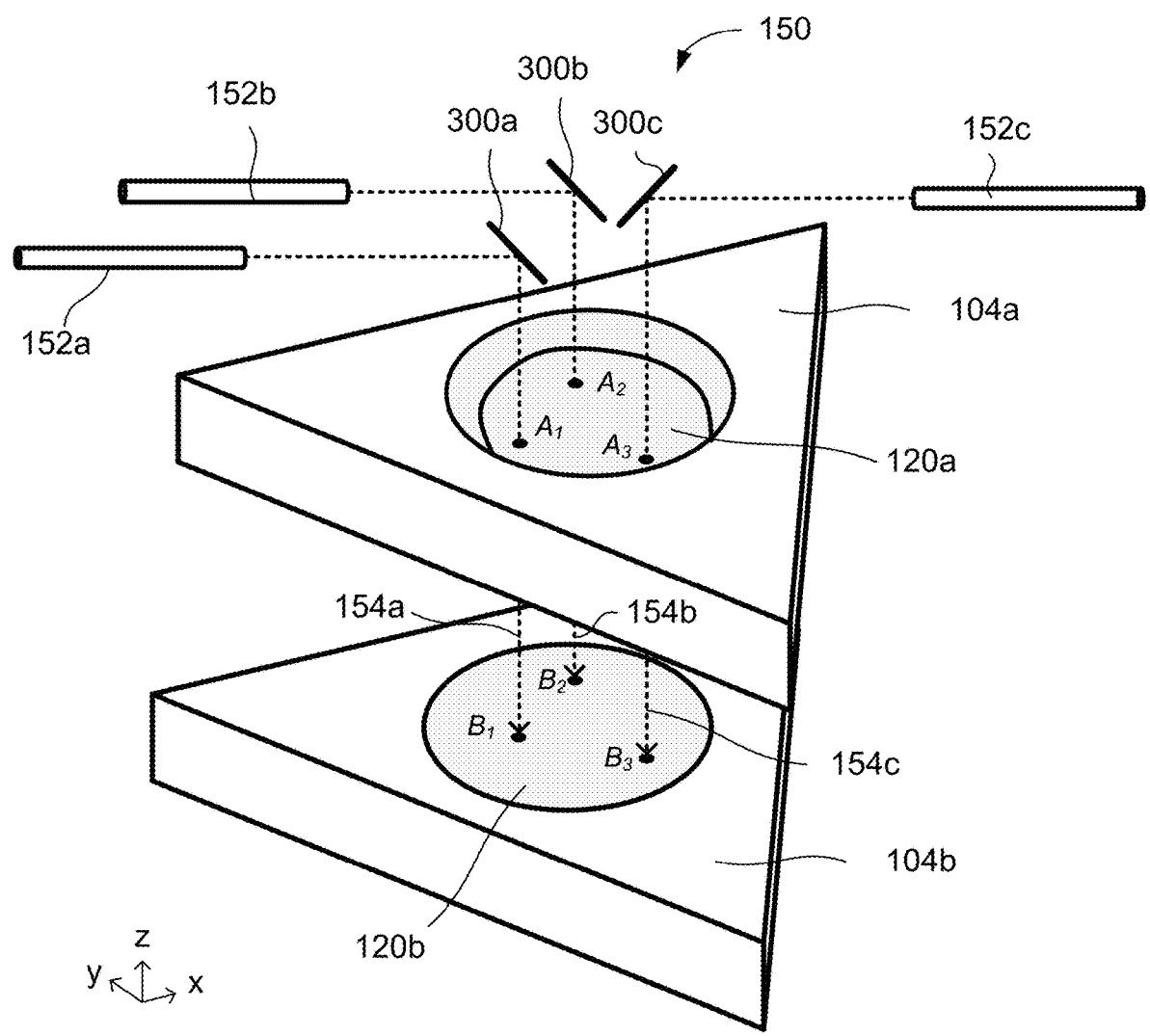
FIG. 3B is a diagram of another example module for determining the positions mold structures relative to one another.

For example, FIG. 3B shows a perspective view of another example configuration of the position determination module 150 relative to the mold structure 104a and the mold structure 104b. In this example, the sensor modules 152a-152c are mounted remote from the mold structures 104a and 104b. Further, the sensor modules 152a-152c are positioned such that the light sources of the sensor module 152a-152c emit light in a direction different from the measurement axes 154a-154c, respectively (e.g., orthogonal to the measurement axes 154a-154c). The light emitted by the sensor modules 152a-152c is reflected by mirrors 300a-300c, respectively, such that they propagate along the measurement axes 154a-154c, respectively. Further, light that is reflected from the mold structures 104a and 104b is also re-directed by the mirrors 300a-300c back towards the sensor modules 152a-152c for measurement.

The control module 110 is communicatively coupled to the actuable stages 102a and 102b and the position determination module 150, and is configured to control the positions of the mold structures 104a and 104b relative to one another based on the measurements obtained by the position determination module 150. For instance, the control module 110 can receive measurements from the position determination module 150, and continuously, periodically, or intermittently reposition and/or reorient one or both of the mold structures 104a and 104b in response (e.g., by transmitting commands to the actuable stages 102a and 102b). In some implementations, the control module 110 can reposition one or both of the mold structures 104a and 104b to reduce or eliminate an angle between the opposing mold surfaces that contact the polymer film (e.g., such that the surfaces 120a and 120b are parallel or substantially parallel).

Accordingly, variations in thickness and/or distortions in the resulting polymer film may be reduced.

In some implementations, the position determination module 150 can determine the depths of the surfaces of the mold structures 104a and 104b along the measurements axes 154a-154c, relative to the position of the sensor modules 152a-152c and/or the other surfaces of the mold structures. For example, if the measurement axes 154a-154c are aligned with the z-axis, the sensor modules 152a-152c can determine the relative depths of the surfaces of the mold structures 104a and 104b with respect to the z-axis.

Further, if the positions of the sensor modules 152a-152c with respect to the x-axis and y-axis are known, the control module 110 can ascertain the positions of the surfaces of the mold structures 104a and 104b with respect to all three axes (e.g., x-, y-, and z-axes). The positions of the sensor modules 152a-152c with respect to the x-axis and y-axis can be determined, for example, based the known fixed positions of the sensor module 152a-152c relative to the mold structure 104a and/or mold structure 104b, and known positions of the mold structures 104a and/or mold structure 104b relative to a reference coordinate system (e.g., a "wafer coordinate system" that is expressed relative to the one or more components of the system 100, such as the surfaces 120a and/or 120b).

In some implementations, the positions of the surfaces of the mold structures 104a and 104b can be expressed as a series of coordinates. For example, the point $A_1$ on the mold structure 104a can be expressed as $(x_1, y_1, z_1)$ with respect to the wafer coordinate system, where $z_1$ is determined based on measurements obtained by the position determination module 150, and $x_1$ and $y_1$ are determined based on the known position of the position determination module 150 relative to the mold structures 104a and/or 104b. Similarly, the point $A_2$ on the mold structure 104a can be expressed as $(x_2, y_2, z_2)$ with respect to the wafer coordinate system, and the point $A_3$ on the mold structure 104a can be expressed as $(x_3, y_3, z_3)$ with respect to the wafer coordinate system.

Based on this information, the control module 110 can determine the rotation (or "tip" and "tilt") of the surfaces of the mold about the x- and y-axes. For example, this can be determined using the relationship:

$$\begin{bmatrix} y1 & -x1 & 1 \\ y2 & -x2 & 1 \\ y3 & -x3 & 1 \end{bmatrix} \begin{bmatrix} Rx \\ Ry \\ Z \end{bmatrix} = \begin{bmatrix} z1 \\ z2 \\ z3 \end{bmatrix}, \qquad \text{Eq. 1}$$

where Rx corresponds to the rotation of the surface of the mold structure about the x-axis, Ry corresponds to the rotation of the surface of the mold structure about the y-axis, and Z corresponds to the translation of the surface of the mold structure along the z-axis (e.g., relative to a reference point). The values Rx, Ry, and Z can be determined, for example, by performing an matrix inversion operation with respect to the relationship above.

The control module 110 can perform a similar calculation with respect to the other mold surface, such that it also determines the rotation of the surface of the other mold structure about the x-axis, the rotation of the surface of the other mold structure about the y-axis, and the translation of the surface of the mold structure along the z-axis relative to the reference point.

Further, the control module 110 can adjust the position of the mold structure 104 and/or the mold structure 104b to reduce or eliminate misalignment between the surfaces of the mold structures 104a and 104b that contact the polymer film (e.g., the surfaces 120a and 120b). For example, the control module 110 can adjust the position of the mold structure 104a and/or the mold structure 104b such that Rx for the surface 120a of the mold structure 104a is equal to or substantially equal to Rx for the surface 120b of the mold structure 104b, and Ry for the surface 120a of the mold structure 104a is equal to or substantially equal to Ry for the surface 120b of the mold structure 104b. Further, the control module 110 can adjust the position of the mold structure 104a and/or the mold structure 104b such that the difference between Z for the surface 120a of the mold structure 104a and Z for the surface 120b of the mold structure 104b is a particular distance (e.g., corresponding to a desired thickness of the resulting polymer film).

In some implementations, the position determination module 150 can determine the position of the mold structures 104a and/or 104b a single time (e.g., prior to the curing of a polymer film). In some implementations, the position determination module 150 can determine the position of the mold structures 104a and/or 104b multiple times before, during, and/or after the curing of the polymer film (e.g., continuously, periodically, or intermittently). In some implementations, the position determination module 150 can store measurements for later retrieval and processing (e.g., using one or more storage devices). In some implementations, the measurements can be provided by to the control module 110 for storage (e.g., using one or more storage devices).

Further, the control module 110 can adjust the position of the mold structures 104a and/or 104b a single time, or multiple times before, during, and/or after the curing of the polymer film (e.g., continuously, periodically, or intermittently). In some implementations, the control module 110 can adjust the position of the mold structures 104a and/or 104b according to a feedback loop (e.g., a closed loop), with the measurements from the position determination system 150 used as control inputs.

In at least some of the examples described above, a position determination module 150 can include at least three sensor modules 152a-152c, each having a respective light source and a respective an interferometer. However, in some implementations, a position determination module can include a single light source and/or interferometer. Light emitted by the light source can be distributed along three or more measurement axes (e.g., using one or more beam splitters, mirrors, and/or reflective surfaces). Further, light reflecting from the mold structures can be directed to the interferometer (e.g., using one or more beam combiners, mirrors, and/or reflective surfaces). In some implementations, a position determination module 150 can include one or more autocollimators to measure reflections with respect to multiple different measurement axes concurrently.

Figure 4A:
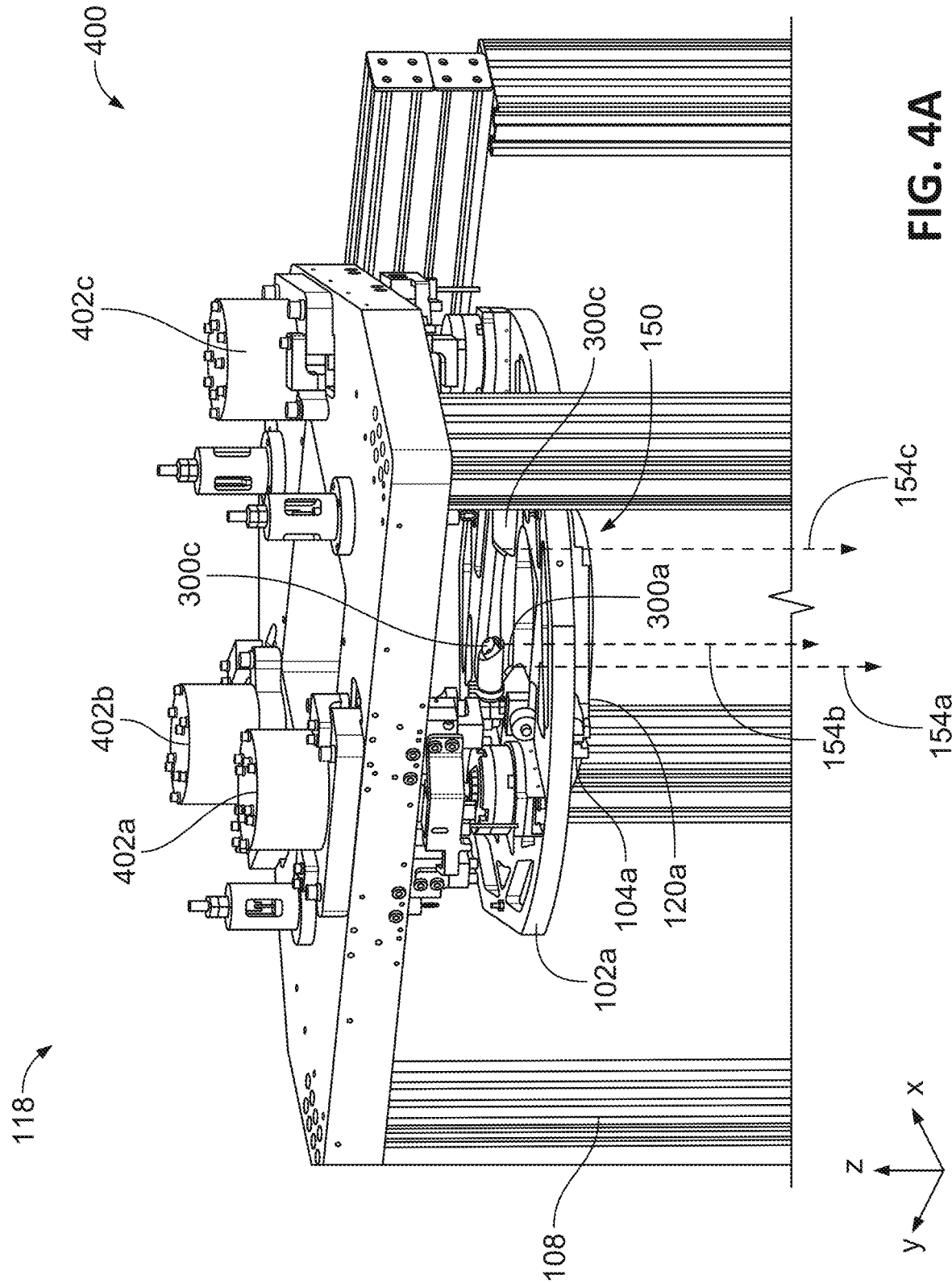
FIGS. 4A-4D are diagrams of another example module for determining the positions mold structures relative to one another.
Figure 4B:
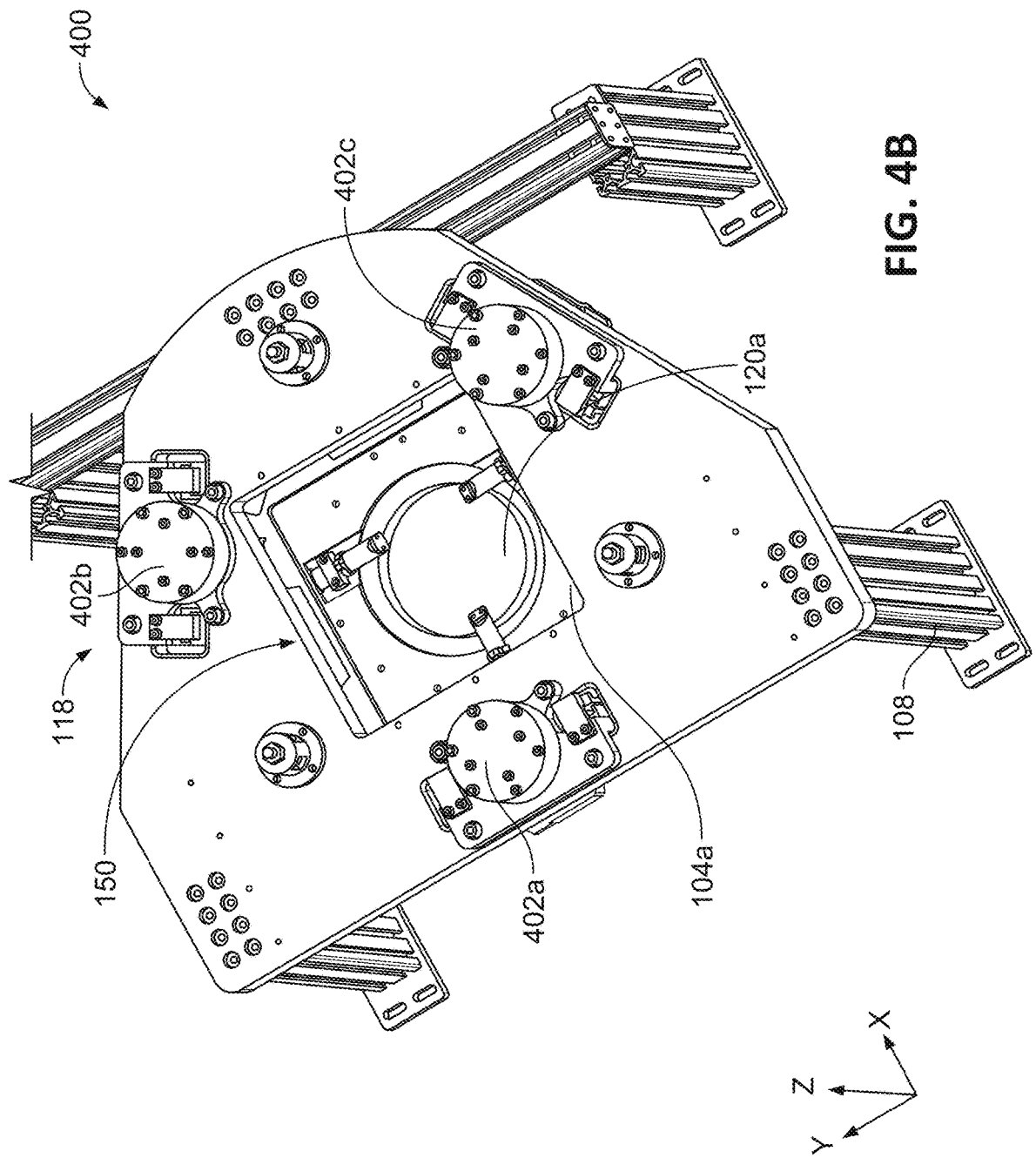
Figure 4C:
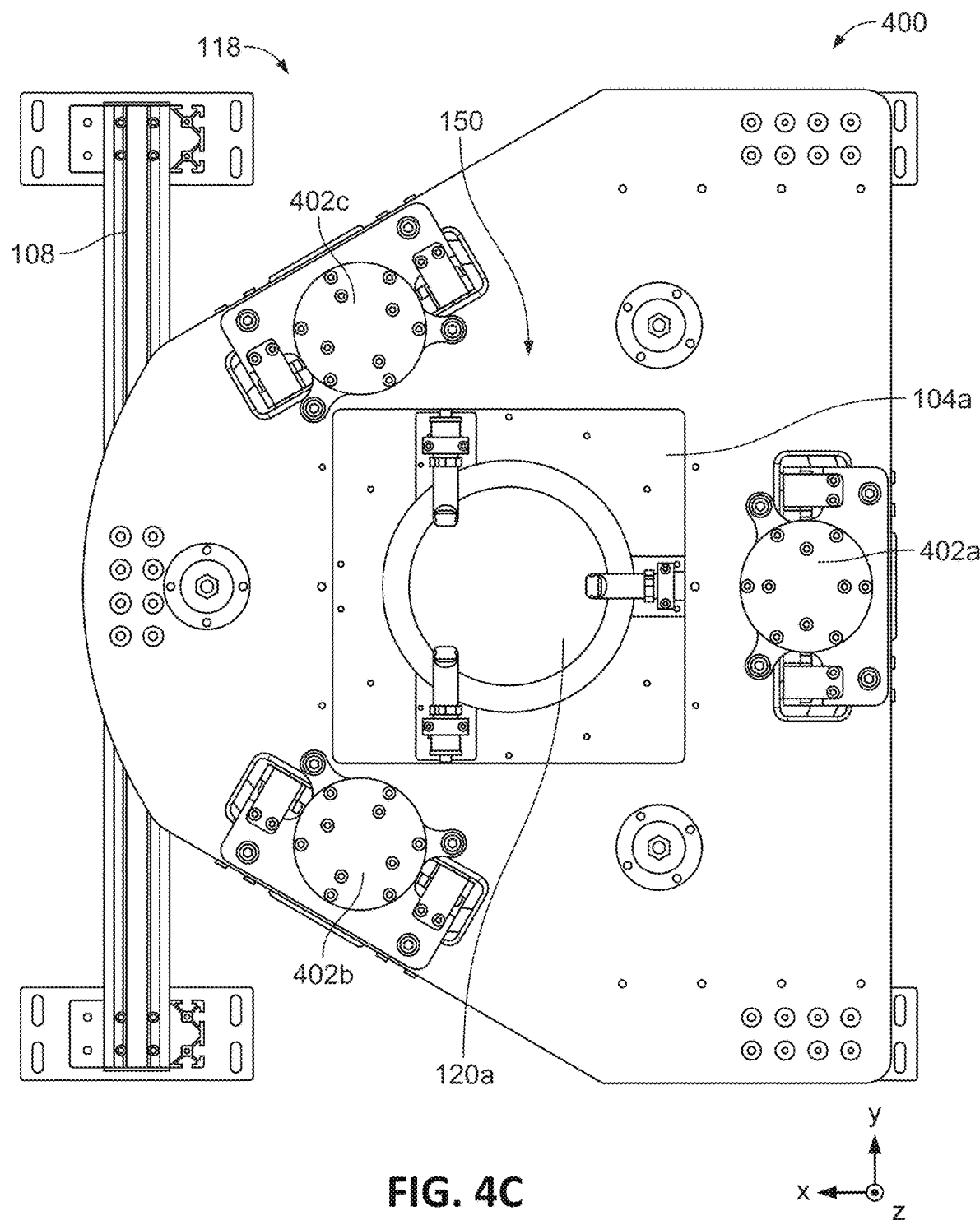
Figure 4D:
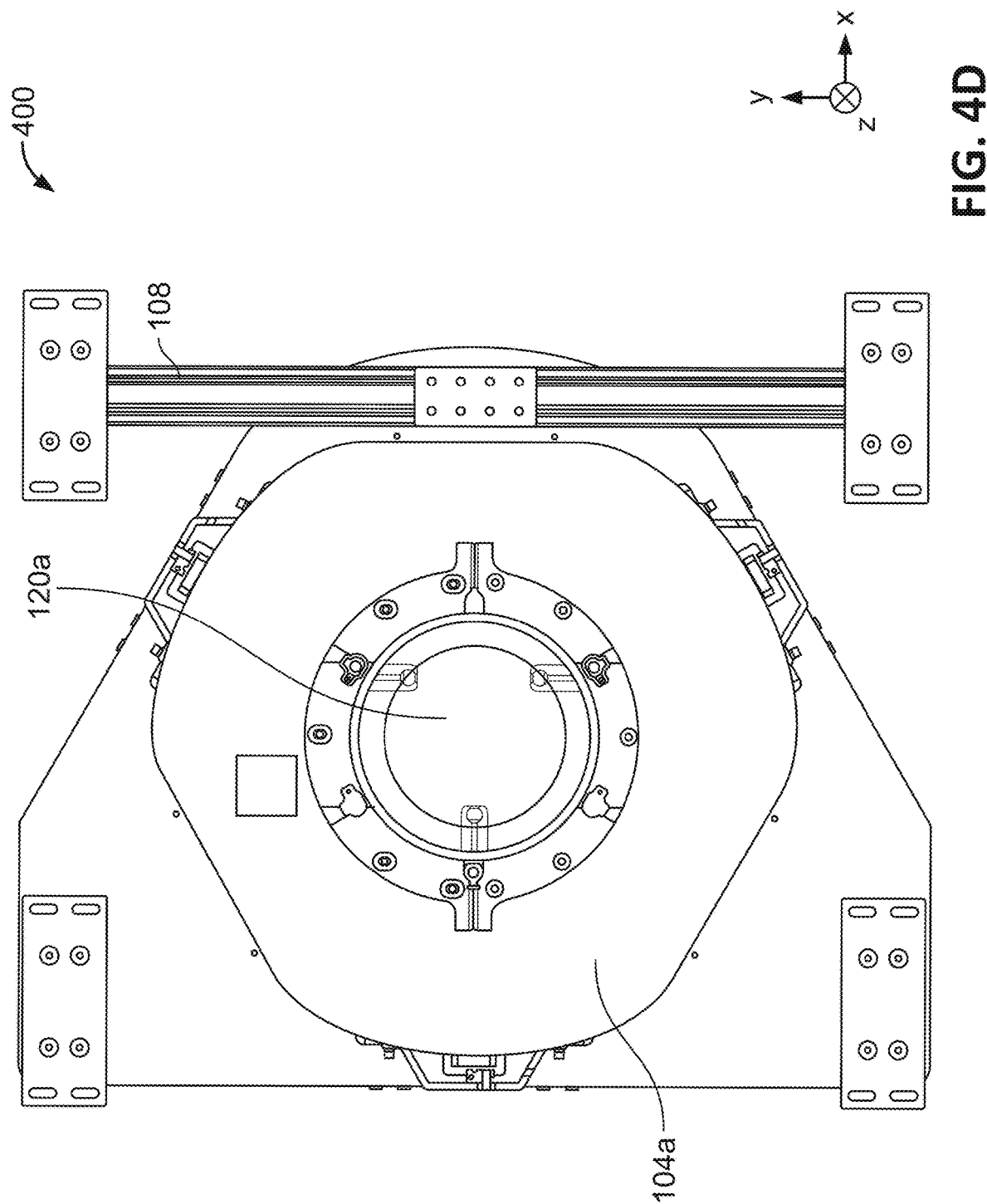

FIGS. 4A-4D show an upper portion of a system 400 for producing polymer film (e.g., the portion of the system configured to manipulate an upper actuable stage and mold structure). For ease of illustration, the lower portion of the system 400 (e.g., the portion of the system configured to manipulate a lower actuable stage and mold structure) is not shown. FIGS. 4A and 4B shows the system 400 according to perspective views, FIG. 4C shows the system according to an upper view, and FIG. 4D shows the system according to a bottom view.

In general, the system 400 can be similar to the system 100 shown in FIG. 1. For example, the system 400 can include two actuable stages 102a and 102b, two mold structures 104a and 104b, a support frame 108, a control module 110, a motor assembly 118, light sources 106a and 106b, a position determination system 150. For ease of illustration, the control module 110, the light sources 106a and 106b, the actuable stages 102b, and mold structure 104b are not shown.

The system 400 can manipulate the actuable stages 102b and 102b using the motor assembly 118 according to different respective degrees of freedom. For example, the system 400 can be configured to translate the actuable stage 102a (e.g., the upper actuable stage) along the z-direction, and to rotate the actuable stage 102a about the x-axis and the y-axis (e.g., to "tip" or "tilt" the actuable stage 102a). However, the system 400 can be configured to constrain translation of the actuable stage 102a along the y-direction and the x-direction, and to constrain rotation of the actuable stage 102 about the z-axis.

As another example, the system 400 can be configured to translate the actuable stage 102b (e.g., the lower actuable stage) along the x-direction, the y-direction, and the z-direction, and to rotate the actuable stage 102a about the z-axis. However, the system 400 can be configured to constrain rotation of the actuable stage 102b about the x-axis and the y-axis.

This configuration enables the system 400 to align the actuable stage 102a and 102b relative to one another (e.g., to facilitate performance of the molding and casting process). Further, this can reduce the complexity of operating and maintaining the system (e.g., by reducing the degrees of freedom of the system to a limited subset). Nevertheless, in some implementations, the system 400 can be configured to manipulate the actuable stage 102a and/or the actuable stage 102b according to six digress of freedom (e.g., translation along the x-direction, the y-direction, and the z-direction, and rotation about the x-direction, the y-direction, and the z-direction), or according to any subset of thereof.

As shown in FIGS. 4A-4C, the motor assembly 118 includes several motors 402a-402c to manipulate the actuable stage 102a. One or more of the motors 402a-402c can be linear motors. For example, a motor 402a-402c can include a voice coil and an optical linear encoder that tracks the vertical position (e.g., z-position) of opposing mounting surfaces of the motor (e.g., a mounting surface secured to the support frame, and another mounting surface secured to the actuable stage 102a). The control module 110 (e.g., as shown in FIG. 1) is configured to apply an electrical current to the voice coil. This electric current induces a magnetic force through the voice coil, which provides a motive force (e.g., pushing or pulling the mounting structures of the motor away or towards each other).

The control module 110 can be configured to apply varying amount of electrical current to the voice coil to control actuation of the motor. Further, the optical linear encoders of each of the motors 402a-402c and the control module can operate in conjunction to manipulate the actuable stage 102a in different ways. For instance, the control module 110 can determine the position of each of the motors 402a-402c using the optical linear encoders, and can apply different patterns of electrical current to each of the voice coils to translate and/or rotate the actuable stage 102a in different ways. As an example, the motors 402a-402c can be operated in unison to raise or lower the actuable stage 102a in the z-direction. As another example, the motors 402a-402c can be operated to selectively raise the actuable 102a stage at one or more points and/or to lower the actuable stage 102b at one or more other points selectively (e.g., to tip or tilt the actuable stage 102a). One or more of the actuable motors 402a-402c can remain stationary during a position adjustment.

As described herein, the position determination module 150 can measure the positions of at least three points on each of the mold structures 104a and 104b (e.g., three non-linear points that form a notional triangle on the surfaces 120a and 120b). Based on this information, the system 100 can determine the position of the mold structures 104a and 104b in space, and adjust the position of one or more of the mold structures 104a and 104b to reduce or eliminate misalignment between the opposing mold surfaces that contact the polymer film (e.g., such that the surfaces 120a and 120b are parallel or substantially parallel).

In the example shown in FIGS. 4A-4D, the position determination module includes three sensor modules 152a-124c (e.g., LCI sensors), each configured to measure points on the mold structures 104a and 104b along a respective measurement axis 154a-154c. Further, in this example, each of the sensor modules 124a-124c is mounted to the actuable stage 102a and/or mold structure 104a in such a way that it emits a beam of low-coherence light in a direction orthogonal to the z-axis (e.g., along the x-y plane). Further, each of the sensor modules 152a-152c include a respective mirror 300a-300c. The mirrors 300a-300c are positioned such that the beams of light emitted by the sensor modules 152a-152c are reflected by the mirrors 300a-300c, respectively, and propagate along the measurement axes 154a-154c, respectively. Further, light that is reflected form the mold structures 104a and 104b are also re-directed by the mirrors 300a-300c back towards the sensor modules 152a-152c for measurement. As shown in FIG. 4C, the sensor modules 152a-152c can be positioned beyond the periphery of the portion of the surface 120a that contacts the photocurable material, such they do not block the light emitted by the light sources 106a or 106b from reaching the gap volume between the mold structures 104a and 104b and curing the photocurable material. Further, due to the inclusion of the mirrors 300a-300c, the sensor modules 152a-152c can be positioned with their longer edges flush against the actuable stage 102a and/or mold structure 104a, thereby reducing the vertical profile of the position determination module 150. This can be useful, for example, as it enables the system 400 to be implemented in a more compact form factor.

Example Processes

Figure 5:
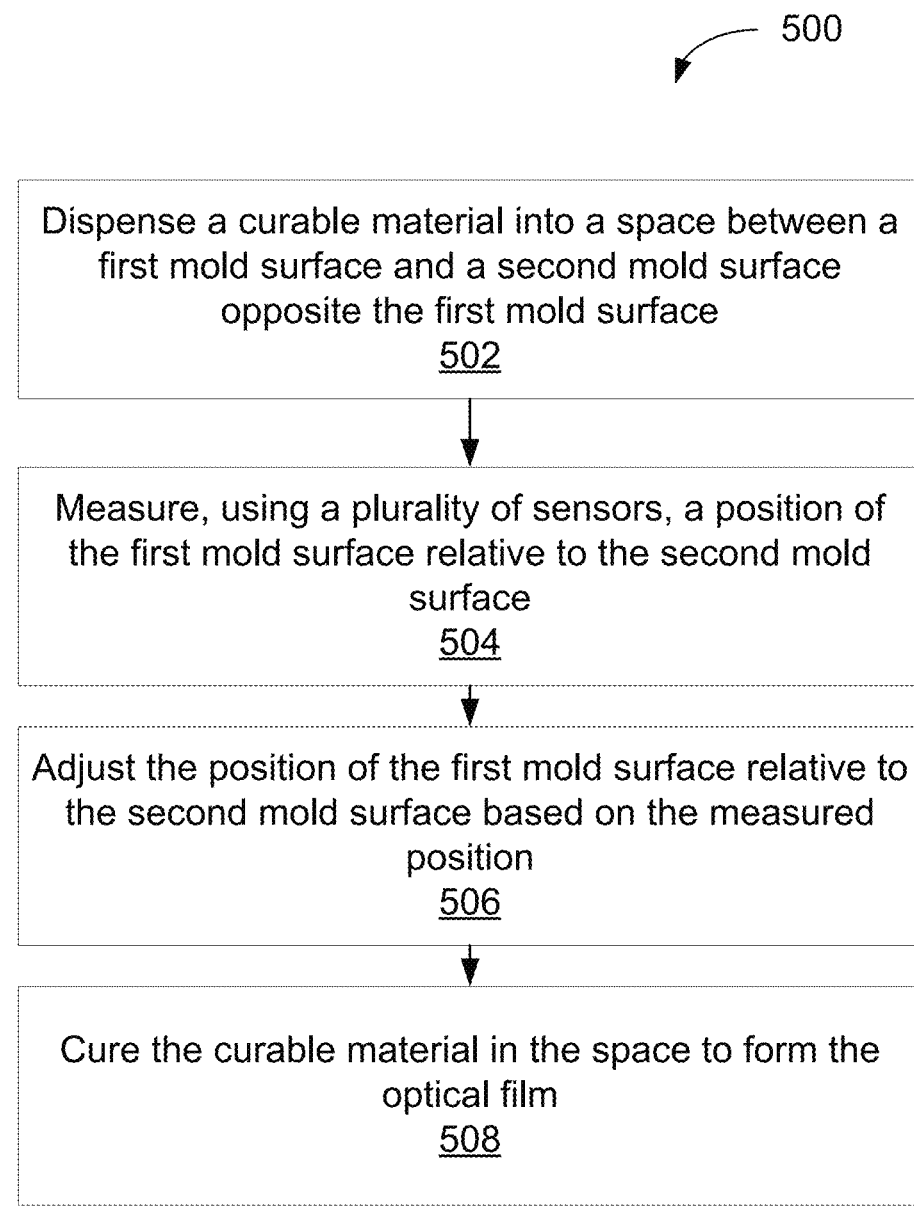
FIG. 5 is a flow chart diagram of an example process for producing a polymer product.

FIG. 5 shows an example process 500 for forming an optical film for an eyepiece of a display device. The process 500 can be performed, for example, using the systems 100 or 400. In some implementations, the process 500 can be used to produce polymer films suitable for use in optical applications (e.g., as a part of waveguides or eyepieces in an optical imaging system). In some implementations, the process can be particularly useful for producing waveguides or eyepieces suitable for use in a head mounted display device, such as one used for presenting virtual reality content and/or augmented reality content).

In the process 500, a curable material is dispensed into a space between a first mold surface and a second mold surface opposite the first mold surface (step 502). As an example, referring to FIG. 1, a curable material can be dispensed into the gap volume 116 between the surface 120a of the mold structure 104a and the surface 120b of the mold structure 104b.

A position of the first mold surface relative to the second mold surface is determined using a plurality of sensors (step 504). This includes determining a first relative distance along a first measurement axis between a first point on a planar portion of the first mold surface and a first point on a planar portion of the second mold surface using a first of the sensors. This also includes determining a second relative distance along a second measurement axis between a second point on the planar portion of the first mold surface and a second point on the planar portion of the second mold surface using a second of the sensors. This also includes determining a third relative distance along a third measurement axis between a third point on the planar portion of the first mold surface and a third point on the planar portion of the second mold surface using a third of the sensors. The first, second, and third measurement axes are parallel to each other. Further, the first, second, and third points define corresponding triangles on the first and second mold surfaces, respectively. The space between the first and second mold surfaces is located within the triangles.

As an example, referring to FIGS. 1, 3A, and 3B, a first relative distance can be determined along a measurement axis 154a between points $A_1$ and $B_1$ using a first sensor module 152a, a second relative distance can be determined along a measurement axis 154b between points $A_2$ and $B_2$ using a second sensor module 152b, and a third relative distance can be determined along a measurement axis 154c between points $A_3$ and $B_3$ using a third sensor module 152c.

In implementations, the position of the first mold surface relative to the second mold surface can be determined prior to curing the curable material. In some implementations, the position of the first mold surface relative to the second mold surface can be determined concurrently with curing the curable material. In some implementations, the position of the first mold surface relative to the second mold surface can be determined continuously over time.

In some implementations, adjusting the position of the first mold surface relative to the second mold surface can include determining, based on the position of the first mold surface relative to the second mold surface, one or more adjustments to at least one of a position of the first mold surface or a position of the second mold surface can be made to reduce an angle between the planar portion of the first mold surface and the planar portion of the second mold surface (e.g., such that the surfaces 120a and 120b are parallel or substantially parallel). Further, one or more actuators can be activated to move the at least one of the first mold surface or the second mold surface according to the one or more determined adjustments. Example actuators are shown and described, for example, with respect to FIGS. 4A-4D.

In some implementations, the one or more adjustments can include a translation of at least one of the first mold surface or the second mold surface along an axis of translation, and/or a rotation of at least one of the first mold surface or the second mold surface about an axis of rotation. In some implementations, the axis of translation can be substantially parallel to the first, second, and third measurement axes. In some implementations, the axis of rotation can be substantially orthogonal to the first, second, and third measurement axes. In some implementations, the term "substantially" can refer to a deviation of no more than 5%.

In some implementations, adjusting the position of the first mold surface relative to the second mold surface can include determining—based on the first relative distance along a first measurement axis, the second relative distance along a second measurement axis, and the third relative distance along a third measurement axis—coordinates (x1, y1, z1), coordinates (x2, y2, z2), and coordinates (x3, y3, z3). The coordinates (x1, y1, z1) can refer to the first point on the planar portion of the first mold surface or the first point on the planar portion of the second mold surface with respect to a Cartesian coordinate system. The coordinates (x2, y2, z2) can refer to the second point on the planar portion of the first mold surface or the second point on the planar portion of the second mold surface with respect to the Cartesian coordinate system. The coordinates (x3, y3, z3) can refer to the third point on the planar portion of the first mold surface or the third point on the planar portion of the second mold surface with respect to the Cartesian coordinate system.

Further, adjusting the position of the first mold surface relative to the second mold surface can include determine the one or more adjustments are determined according to a relationship:

$$\begin{bmatrix} y1 & -x1 & 1 \\ y2 & -x2 & 1 \\ y3 & -x3 & 1 \end{bmatrix} \begin{bmatrix} Rx \\ Ry \\ Z \end{bmatrix} = \begin{bmatrix} z1 \\ z2 \\ z3 \end{bmatrix},$$

where Z corresponds to the translation of at least one of the first mold surface or the second mold surface along an axis of translation, Rx corresponds to the rotation of at least one of the first mold surface or the second mold surface about a first axis of rotation, and Ry corresponds to the rotation of at least one of the first mold surface or the second mold surface about a second axis of rotation.

The position of the first mold surface is adjusted relative to the second mold surface based on the measured position (step 506). In some implementations, the position of the first mold surface relative to the second mold surface can be adjusted prior to curing the curable material. In some implementations, the position of the first mold surface relative to the second mold surface can be adjusted concurrently with curing the curable material. In some implementations, the position of the first mold surface relative to the second mold surface can be adjusted continuously over time.

The curable material is cured in the space to form the optical film (step 508). In some implementations, the curable material can include a photocurable material. Curing the curable material to form the optical film can include irradiating the photocurable material with radiation suitable for photocuring the photocurable material. For example, referring to FIG. 1, the photocurable material can be irradiated with radiation produced by one or more of the light sources 106a and 106b.

In some implementations, the curable material can be confined entirely within the space between the first mold surface and the second mold surface during the curing of the curable material.

In some implementations, the plurality of sensors can include one or more low-coherence interferometry (LCI) sensors. The one or more LCI sensors can be mounted on a first mold portion that includes the first mold surface or a second mold portion that includes the second mold surface. As an example, referring to FIG. 3A, one or more LCI sensors can be mounted on the mold structure 104a and/or the mold structure 104b.

In some implementations, measuring the position of the first mold surface relative to the second mold surface can include directing an optical beam from each of the one or more LCI sensors along a corresponding measurement axis so that, for each LCI sensor, a first portion of the optical beam reflects from the first mold surface and a second portion of the optical beam reflects from the second mold surface. The reflected portions of the optical beam are detected by the LCI sensor. Examples of this technique are show and described, for example, with respect to FIG. 2.

In some implementations, the one or more LCI sensors can be mounted remote from the first mold surface or the second mold portion. Directing the optical beam from at least one of the LCI sensors can include reflecting the optical beam with a mirror toward the first and second mold surfaces. As an example, referring to FIG. 3B, one or more LCI sensors can be mounted remove from the mold structure 104a and/or the mold structure 104b, and optical beams emitted from the LCI sensors can be reflected towards the molds structures using mirrors 300a-300c.

In some implementations, the process 500 can further include separating the optical film from the first mold portion and the second mold portion.

In some implementations, the process 500 can further include assembling a head mounted display including the optical film.

Example Computer System

Some implementations of subject matter and operations described in this specification can be implemented in digital electronic circuitry, or in computer software, firmware, or hardware, including the structures disclosed in this specification and their structural equivalents, or in combinations of one or more of them. For example, in some implementations, the control module 110 and/or the position determination module 150 can be implemented using digital electronic circuitry, or in computer software, firmware, or hardware, or in combinations of one or more of them. In another example, the process 500 shown in FIG. 5 can be implemented, at least in part, using digital electronic circuitry, or in computer software, firmware, or hardware, or in combinations of one or more of them.

Some implementations described in this specification can be implemented as one or more groups or modules of digital electronic circuitry, computer software, firmware, or hardware, or in combinations of one or more of them. Although different modules can be used, each module need not be distinct, and multiple modules can be implemented on the same digital electronic circuitry, computer software, firmware, or hardware, or combination thereof.

Some implementations described in this specification can be implemented as one or more computer programs, i.e., one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer may also include, or be operatively coupled to receive data from or transfer data to, or both, one or more mass storage devices for storing data, e.g., magnetic, magneto optical disks, or optical disks. However, a computer need not have such devices. Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. The processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

Figure 6:
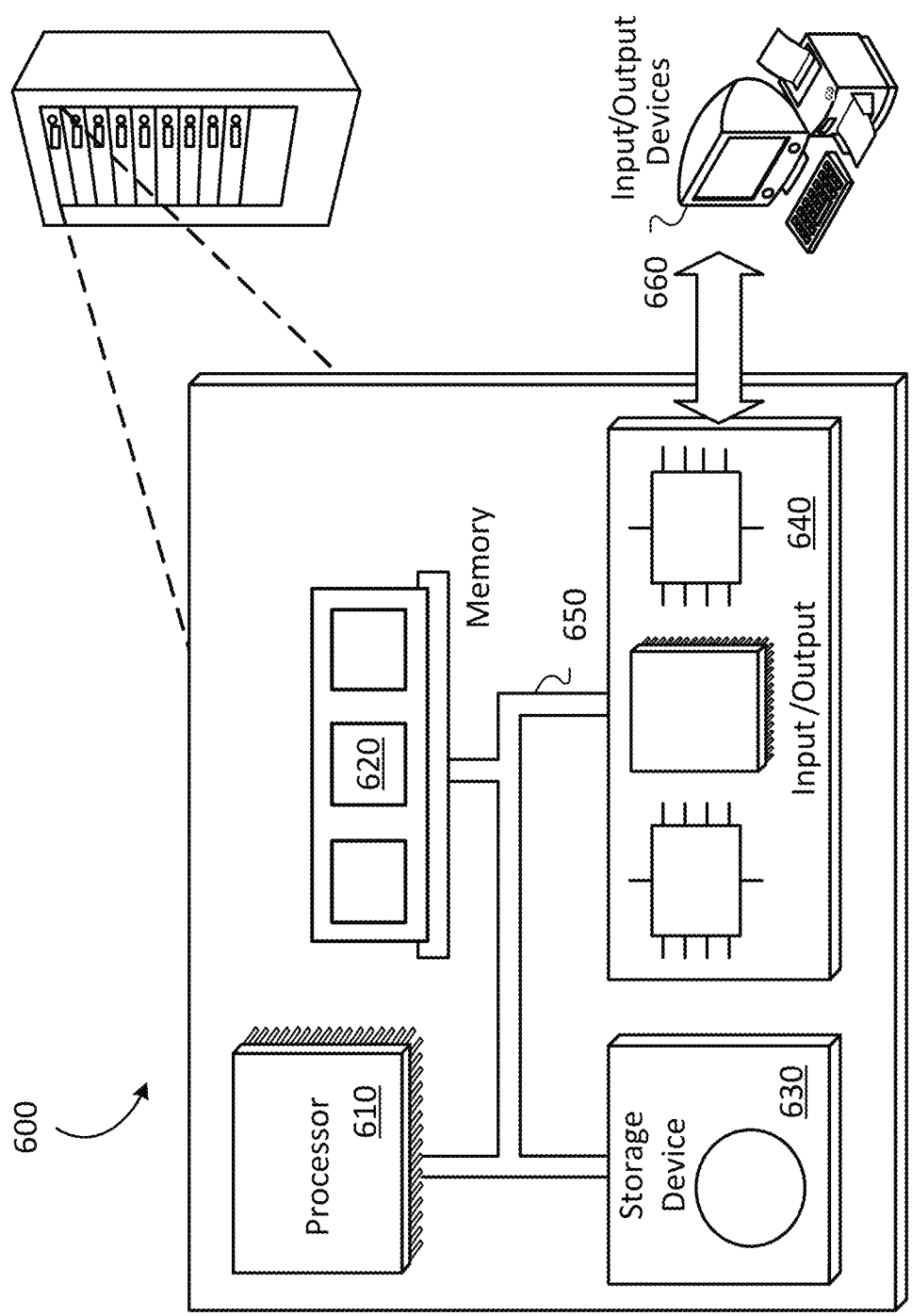
FIG. 6 is a diagram of an example computer system.

FIG. 6 shows an example computer system 600 that includes a processor 610, a memory 620, a storage device 630 and an input/output device 640. Each of the components 610, 620, 630 and 640 can be interconnected, for example, by a system bus 650. The processor 610 is capable of processing instructions for execution within the system 600. In some implementations, the processor 610 is a single-threaded processor, a multi-threaded processor, or another type of processor. The processor 610 is capable of processing instructions stored in the memory 620 or on the storage device 630. The memory 620 and the storage device 630 can store information within the system 600.

The input/output device 640 provides input/output operations for the system 600. In some implementations, the input/output device 640 can include one or more of a network interface device, e.g., an Ethernet card, a serial communication device, e.g., an RS-232 port, and/or a wireless interface device, e.g., an 802.11 card, a 3G wireless modem, a 4G wireless modem, etc. In some implementations, the input/output device can include driver devices configured to receive input data and send output data to other input/output devices, e.g., keyboard, printer and display devices 660. In some implementations, mobile computing devices, mobile communication devices, and other devices can be used.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination.

A number of implementations have been described. Nevertheless, it will be understood that various modifications may be made without departing from the spirit and scope of the invention. Accordingly, other implementations are within the scope of the following claims.

What is claimed is:

1. A method of forming an optical film for an eyepiece, the method comprising:
   dispensing a curable material into a space between a first mold surface and a second mold surface opposite the first mold surface;
   measuring, using a plurality of sensors, a position of the first mold surface relative to the second mold surface, wherein measuring the position of the first mold surface relative to the second mold surface comprises:
      determining a first relative distance along a first measurement axis between a first point on a planar portion of the first mold surface and a first point on a planar portion of the second mold surface using a first of the sensors;

determining a second relative distance along a second measurement axis between a second point on the planar portion of the first mold surface and a second point on the planar portion of the second mold surface using a second of the sensors; and determining a third relative distance along a third measurement axis between a third point on the planar portion of the first mold surface and a third point on the planar portion of the second mold surface using a third of the sensors, wherein the first, second, and third measurement axes are parallel to each other, the first, second, and third points define corresponding triangles on the first and second mold surfaces, respectively, and the space between the first and second mold surfaces is located within the triangles;

determining, based on the first relative distance along a first measurement axis, the second relative distance along a second measurement axis, and the third relative distance along a third measurement axis:

coordinates (x1,y1,z1) of the first point on the planar portion of the first mold surface or the first point on the planar portion of the second mold surface with respect to a Cartesian coordinate system, coordinates (x2,y2,z2) of the second point on the planar portion of the first mold surface or the second point on the planar portion of the second mold surface with respect to the Cartesian coordinate system, coordinates (x3,y3,z3) of the third point on the planar portion of the first mold surface or the third point on the planar portion of the second mold surface with respect to the Cartesian coordinate system, and wherein the one or more adjustments are determined according to a relationship $$\begin{bmatrix} y1 & -x1 & 1 \\ y2 & -x2 & 1 \\ y3 & -x3 & 1 \end{bmatrix} \begin{bmatrix} Rx \\ Ry \\ Z \end{bmatrix} = \begin{bmatrix} z1 \\ z2 \\ z3 \end{bmatrix},$$

wherein Z corresponds to the translation of at least one of the first mold surface or the second mold surface along an axis of translation, wherein Rx corresponds to the rotation of at least one of the first mold surface or the second mold surface about a first axis of rotation, and wherein Ry corresponds to the rotation of at least one of the first mold surface or the second mold surface about a second axis of rotation;

adjusting the position of the first mold surface relative to the second mold surface based on the measured position; and curing the curable material in the space to form the optical film.

2. The method of claim 1, wherein the position of the first mold surface relative to the second mold surface is measured prior to curing the curable material.

3. The method of claim 1, wherein the position of the first mold surface relative to the second mold surface is measured concurrently with curing the curable material.

4. The method of claim 1, wherein the position of the first mold surface relative to the second mold surface is measured continuously over time, and wherein the position of the first mold surface relative to the second mold surface is adjusted continuously over time.

5. The method of claim 1, wherein the position of the first mold surface relative to the second mold surface is adjusted prior to curing the curable material.

6. The method of claim 1, wherein the position of the first mold surface relative to the second mold surface is adjusted concurrently with curing the curable material.

7. The method of claim 1, wherein adjusting the position of the first mold surface relative to the second mold surface comprises:

determining, based on the position of the first mold surface relative to the second mold surface, one or more adjustments to at least one of a position of the first mold surface or a position of the second mold surface to reduce an angle between the planar portion of the first mold surface and the planar portion of the second mold surface; and activating one or more actuators to move the at least one of the first mold surface or the second mold surface according to the one or more determined adjustments.

8. The method of claim 7, wherein the one or more adjustments comprises at least one of:

a translation of at least one of the first mold surface or the second mold surface along an axis of translation, or a rotation of at least one of the first mold surface or the second mold surface about an axis of rotation.

9. The method of claim 8, wherein the axis of translation is substantially parallel to the first, second, and third measurement axes.

10. The method of claim 8, wherein the axis of rotation is substantially orthogonal to the first, second, and third measurement axes.

11. The method of claim 1, wherein the plurality of sensors comprises one or more low-coherence interferometry (LCI) sensors.

12. The method of claim 11, wherein the one or more LCI sensors are mounted on a first mold portion that comprises the first mold surface or a second mold portion that comprises the second mold surface, and wherein measuring the position of the first mold surface relative to the second mold surface comprises directing an optical beam from each of the one or more LCI sensors along a corresponding measurement axis so that, for each LCI sensor, a first portion of the optical beam reflects from the first mold surface and a second portion of the optical beam reflects from the second mold surface, the reflected portions of the optical beam being detected by the LCI sensor.

13. The method of claim 12, wherein the one or more LCI sensors are mounted remote from the first mold surface or the second mold portion, and directing the optical beam from at least one of the LCI sensors comprising reflecting the optical beam with a mirror toward the first and second mold surfaces.

14. The method of claim 1, wherein the curable material comprises a photocurable material, and wherein curing the curable material to form the optical film comprises irradiating the photocurable material with radiation suitable for photocuring the photocurable material.

15. The method of claim 1, wherein the curable material is confined entirety within the space between the first mold surface and the second mold surface during the curing of the curable material.

16. The method of claim 1, further comprising separating the optical film from the first mold portion and the second mold portion.

17. A method comprising assembling a head mounted display including the optical film formed using the method of claim 1.

18. A system for forming an optical film for an eyepiece, the system comprising:
a first mold portion having a first mold surface;
a second mold portion having a second mold surface, wherein the first mold surface is opposite the second mold surface;
a dispenser;
a measurement apparatus comprising a plurality of sensors;
one or more actuators coupled to at least one of the first mold portion or the second mold portion; and
a curing apparatus,
wherein the dispenser is configured, during operation of the system, to dispense a curable material into a space between the first mold surface and the second mold surface,
wherein the control module is configured, during operation of the system, to cause the system to measure a position of the first mold surface relative to the second mold surface, wherein measuring the position of the first mold surface relative to the second mold surface comprises:
determining a first relative distance along a first measurement axis between a first point on a planar portion of the first mold surface and a first point on a planar portion of the second mold surface using a first of the sensors,
determining a second relative distance along a second measurement axis between a second point on the planar portion of the first mold surface and a second point on the planar portion of the second mold surface using a second of the sensors, and
determining a third relative distance along a third measurement axis between a third point on the planar portion of the first mold surface and a third point on the planar portion of the second mold surface using a third of the sensors,
wherein the first, second, and third measurement axes are parallel to each other, the first, second, and third points define corresponding triangles on the first and second mold surfaces, respectively, and the space between the first and second mold surfaces is located within the triangles;
determining, based on the first relative distance along a first measurement axis, the second relative distance along a second measurement axis, and the third relative distance along a third measurement axis:
coordinates (x1,y1,z1) of the first point on the planar portion of the first mold surface or the first point on the planar portion of the second mold surface with respect to a Cartesian coordinate system,
coordinates (x2,y2,z2) of the second point on the planar portion of the first mold surface or the second point on the planar portion of the second mold surface with respect to the Cartesian coordinate system,
coordinates (x3,y3,z3) of the third point on the planar portion of the first mold surface or the third point on the planar portion of the second mold surface with respect to the Cartesian coordinate system, and
wherein the one or more adjustments are determined according to a relationship $$\begin{bmatrix} y1 & -x1 & 1 \\ y2 & -x2 & 1 \\ y3 & -x3 & 1 \end{bmatrix} \begin{bmatrix} Rx \\ Ry \\ Z \end{bmatrix} = \begin{bmatrix} z1 \\ z2 \\ z3 \end{bmatrix},$$

wherein Z corresponds to the translation of at least one of the first mold surface or the second mold surface along an axis of translation,
wherein Rx corresponds to the rotation of at least one of the first mold surface or the second mold surface about a first axis of rotation, and
wherein Ry corresponds to the rotation of at least one of the first mold surface or the second mold surface about a second axis of rotation;
wherein the one or more actuators are configured, during operation of the system, to adjust the position of the first mold surface relative to the second mold surface based on the measured position; and
wherein the curing apparatus is configured, during operation of the system, to cure the curable material in the space to form the optical film.

* * * * *